United States Patent
Yamashita et al.

(10) Patent No.: US 6,573,582 B2
(45) Date of Patent: Jun. 3, 2003

(54) SEMICONDUCTOR DEVICE

(75) Inventors: Yasunori Yamashita, Tokyo (JP);
Fumitoshi Yamamoto, Tokyo (JP);
Tomohide Terashima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,906

(22) Filed: Nov. 13, 2001

(65) Prior Publication Data
US 2003/0015765 A1 Jan. 23, 2003

(30) Foreign Application Priority Data
Jul. 23, 2001 (JP) ......................... 2001-221214

(51) Int. Cl.[7] ................ H01L 27/095; H01L 29/00
(52) U.S. Cl. ................ 257/477; 257/474; 257/549; 257/561
(58) Field of Search ................ 257/474, 476, 257/477, 544, 549, 552, 577, 556–561, 550, 565, 593

(56) References Cited

U.S. PATENT DOCUMENTS

| 4,168,997 | A | * | 9/1979 | Compton | 257/544 |
| 4,550,491 | A | * | 11/1985 | Depey | 257/574 |
| 4,831,430 | A | * | 5/1989 | Umeji | 257/463 |
| 4,936,928 | A | * | 6/1990 | Shaw et al. | 148/33 |
| 4,982,244 | A | * | 1/1991 | Kapoor | 257/477 |
| 5,828,124 | A | * | 10/1998 | Villa | 257/557 |

FOREIGN PATENT DOCUMENTS

| GB | 2056767 | * | 3/1981 | 257/474 |
| JP | 58-78451 | * | 5/1983 | 257/477 |
| JP | 3-14270 | * | 1/1991 | 257/477 |

* cited by examiner

Primary Examiner—Tom Thomas
Assistant Examiner—Ori Nadav
(74) Attorney, Agent, or Firm—McDermott, Will & Emery

(57) ABSTRACT

A bipolar transistor is formed on a semiconductor substrate. A Schottky diode is formed in the collector region of the bipolar transistor. The collector region and the semiconductor substrate are isolated in potential from each other by potential isolating layers.

5 Claims, 8 Drawing Sheets

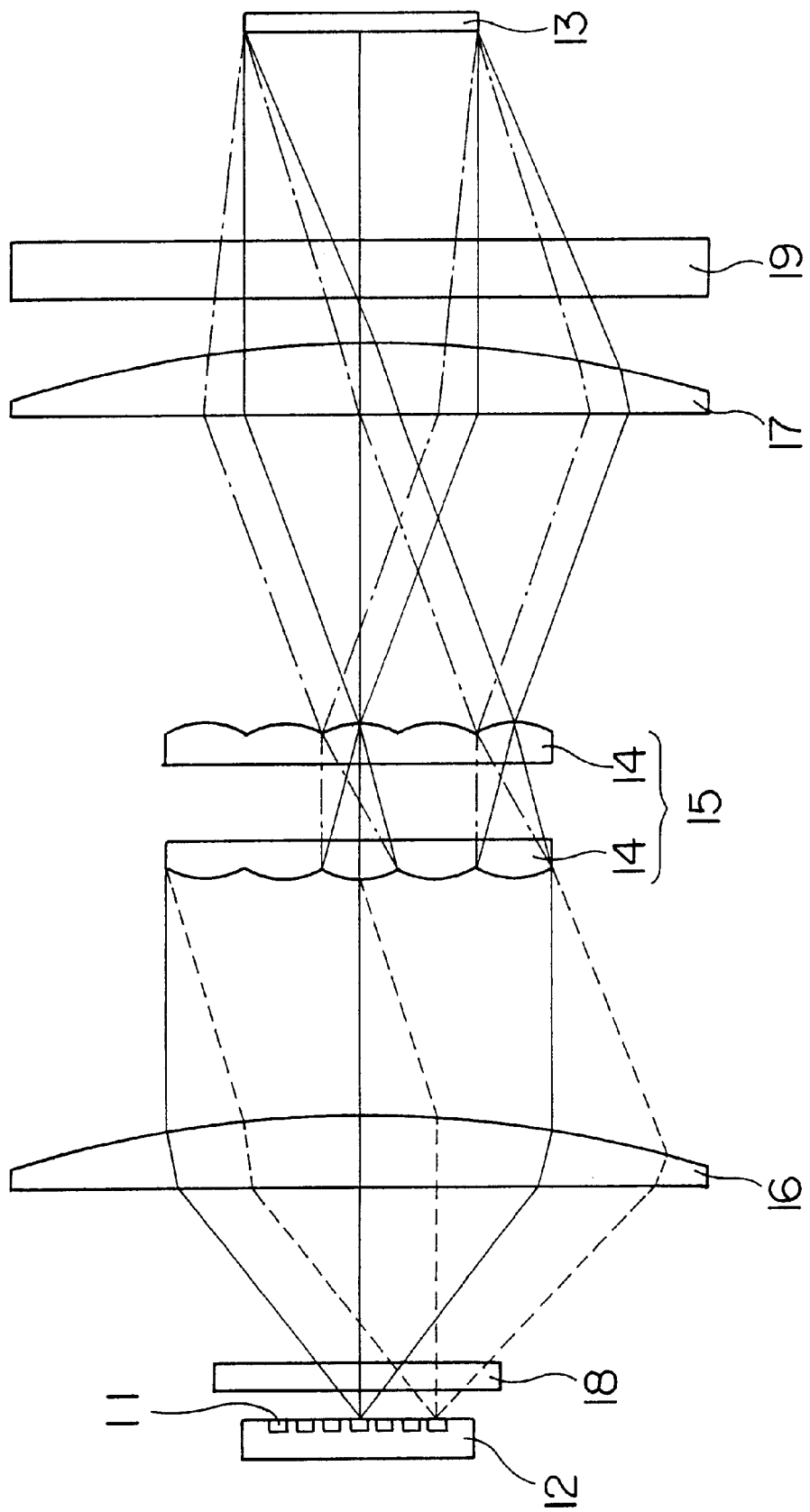
F I G. 1

(A) ON

SEMICONDUCTOR DEVICE

BACKGROUND OF THE INVENTION

1. Field of the Invention

The present invention relates to a semiconductor device and, more particularly, to a semiconductor device having characteristics suitable for forming a drive circuit for a power integrated circuit (hereinafter referred to as "power IC").

2. Background Art

Some driver circuit of a power IC includes a bipolar transistor. FIG. 1 is a sectional view of a semiconductor device including a bipolar transistor, for the driver circuit of a power IC and FIG. 2 is a sectional view of assistance in explaining the operation of the semiconductor device shown in FIG. 1.

Referring to FIG. 1, the semiconductor device has a p-type semiconductor substrate 10. An n-type collector region 12 is formed in an upper part of the semiconductor substrate 10. A p-type base region 14 is formed in the surface of the collector region 12. An n-type emitter region 16 is formed in the surface of the base region 14.

The collector region 12, the base region 14 and the emitter region 16 constitute a bipolar transistor. A buried region 18 of a width slightly greater than that of the emitter region 16 is formed in the vicinity of the boundary between the semiconductor substrate 10 and the collector region 12. The buried region 18 is a region of an n$^+$-type semiconductor formed by diffusion. The buried layer 18 reduces the collector resistance of the bipolar transistor and suppresses the flow of leakage current from the bipolar transistor to the semiconductor substrate 10.

The driver circuit of the power IC needs a transistor for supplying power to a circuit to be driven (hereinafter referred to as "driven circuit"), and a diode for discharging electric energy accumulated in an inductor component (hereinafter referred to as "inductor") of the driven circuit. In the semiconductor device shown in FIG. 1, the joint of the semiconductor substrate 10 and the collector region 12 forms a diode 20 (hereinafter referred to as "collector/substrate diode 20"). The semiconductor device shown in FIG. 1 is suitable for forming the driver circuit of the power IC in a compact structure.

In FIG. 2, the semiconductor substrate 10 of the semiconductor device is grounded, and the collector region 12 is connected to an inductor 22. The collector/substrate diode 20 permits a current to flow from the semiconductor substrate 10 into the inductor 22, so that electric energy accumulated in the inductor 22 can be discharged.

Time necessary to discharge the electric energy accumulated in the inductor 22 is dependent on the operating speed of the collector/substrate diode 20. It is desirable that the electrical energy can be discharged in a short time in view of suppressing of a power loss in the driver circuit; that is, it is desirable that the operating speed of the collector/substrate diode 20 is high. However, a structural restriction makes it difficult for the collector/substrate diode 20 to operate at a high operating speed. Consequently, the driver circuit employing the conventional semiconductor device is apt to involve a large power loss.

SUMMARY OF THE INVENTION

The present invention has been made to solve the foregoing problems and it is therefore an object of the present invention to provide a semiconductor device of construction suitable for forming a driver circuit.

According to one aspect of the present invention, a semiconductor device comprises a semiconductor substrate, a bipolar transistor formed on the semiconductor substrate and having a collector region, a Schottky diode formed in the collector region of the bipolar transistor, and a potential isolating layer isolating the collector region and the semiconductor substrate in potential from each other.

Other and further objects, features and advantages of the invention will appear more fully from the following description.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 2:
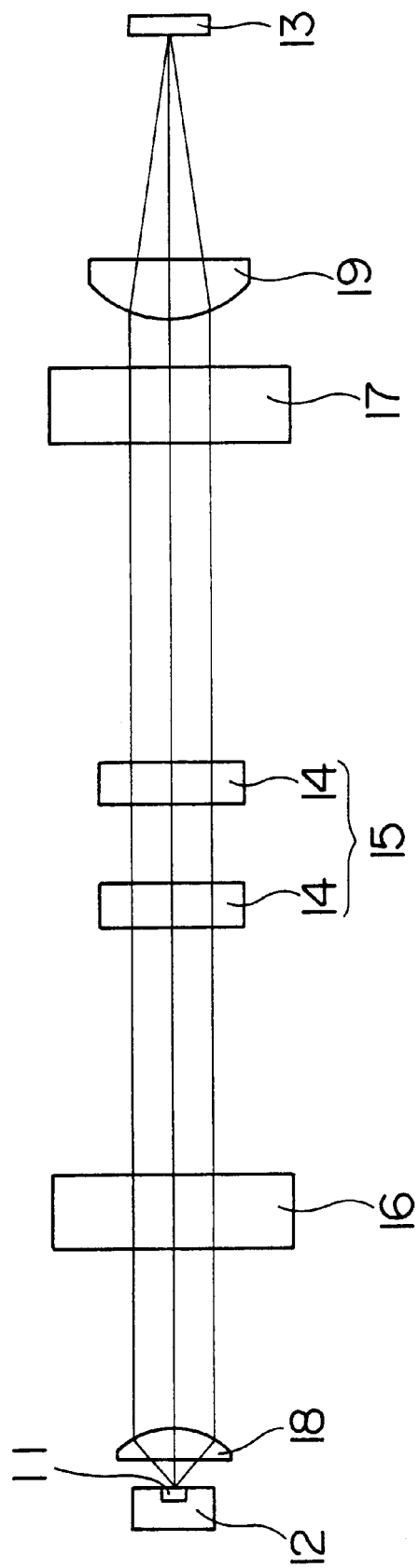
FIG. 2 is a typical sectional view of assistance in explaining the operation of the semiconductor device shown in FIG. 1.

Preferred embodiments of the present invention will be described hereinafter with reference to the accompanying drawings, in which like parts are denoted by the same reference characters and duplicate description thereof will be omitted.

First Embodiment

Figure 3:
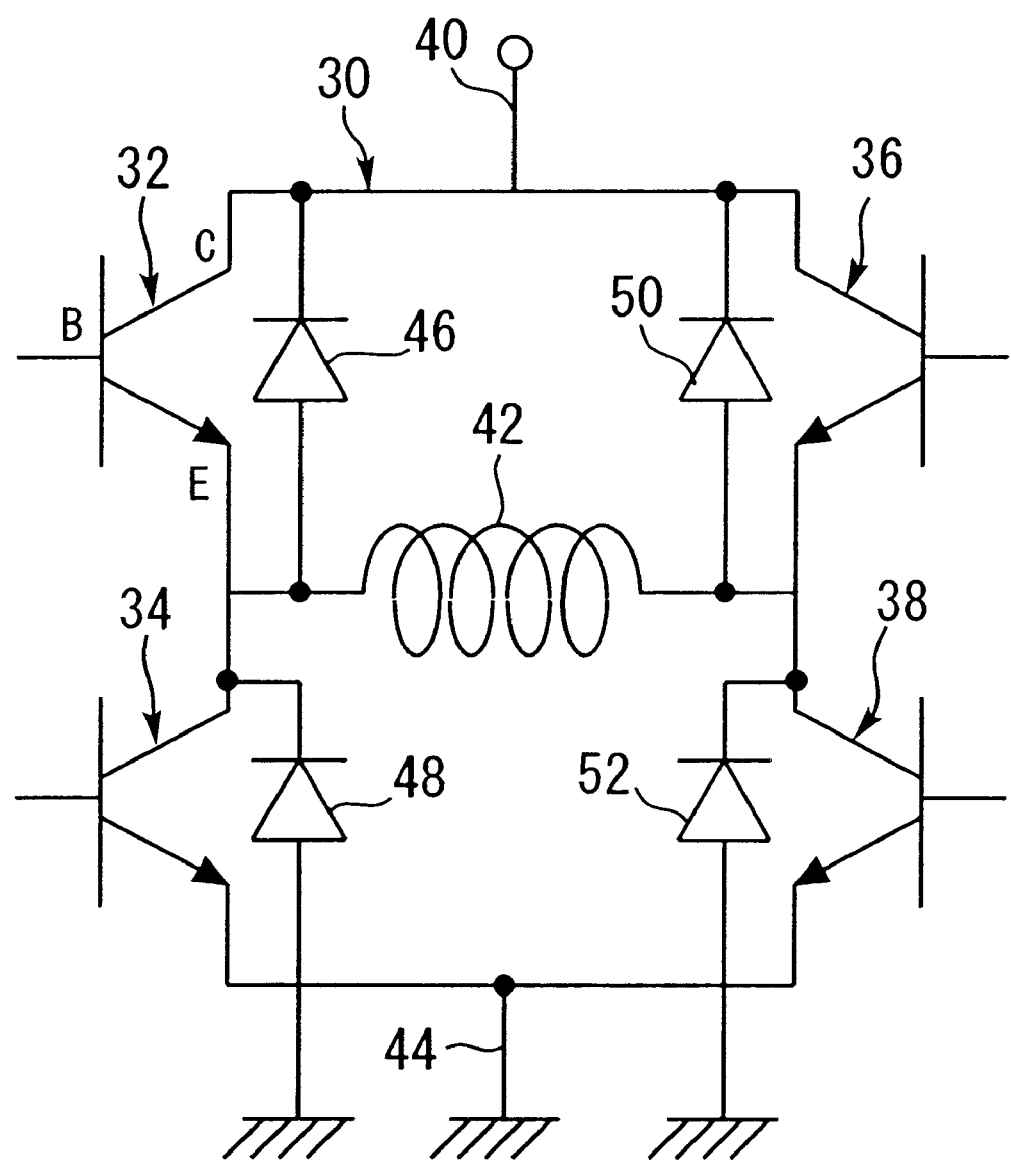
FIG. 3 is a circuit diagram of a driver circuit for a power IC, including semiconductor devices in first to third embodiments according to the present invention.

Referring to FIG. 3 showing a driver circuit 30 for a power IC, including semiconductor devices in a first embodiment according to the present invention, the driver circuit 30 has a bridge circuit consisting of four n-p-n bipolar transistors (hereinafter referred to simply as "transistors") 32, 34, 36 and 38.

The collector terminal of the transistor 32 is connected to a supply voltage terminal 40. The emitter terminal of the transistor 32 and the collector terminal of the transistor 34 are connected to a first end of an inductor 42, i.e., a driven element. The emitter terminal of the transistor 34 is connected to a grounding terminal 44.

Similarly, the collector terminal of the transistor 36 is connected to the supply voltage terminal 40. The emitter terminal of the transistor 36 and the collector terminal of the transistor 38 are connected to a second end of the inductor 42. The emitter terminal of the transistor 38 is connected to the grounding terminal 44.

The respective base terminals of the transistors 32, 34, 36 and 38 are connected to a control circuit, not shown. The control circuit properly turns on and off the transistors 32, 34, 36 and 38 of the driver circuit 30. Then, the driver circuit 30 supplies desired power to the inductor 42.

The driver circuit 30 has a diode 46 connected in parallel to the transistor 32 so that its forward direction corresponds to a direction from the first end of the inductor 42 toward the supply voltage terminal 40, i.e., a direction from the emitter toward the collector of the transistor 32. Similarly, diodes 48, 50 and 52 are connected in parallel to the transistors 34, 36 and 38, respectively, so that the forward direction of each of the diodes 48, 50 and 52 corresponds to a direction from the emitter toward the collector of the corresponding one of the transistors 34, 36 and 38.

Figure 4:
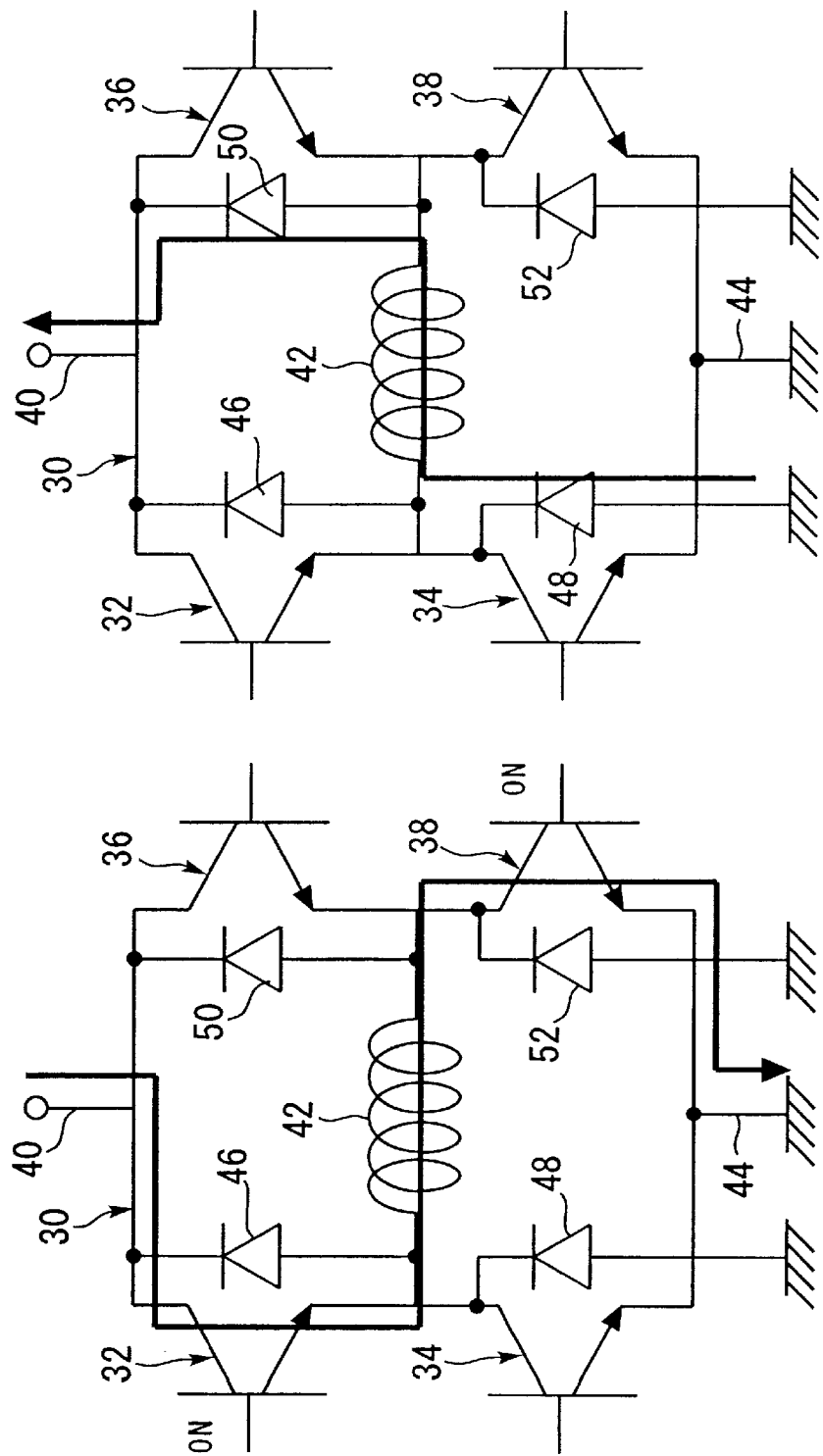
FIGS. 4A and 4B are circuit diagrams of assistance in explaining the operation of the driver circuit shown in FIG. 3.

FIGS. 4A and 4B are circuit diagrams of assistance in explaining the operation of the driver circuit 30. In FIG. 4A, the driver circuit 30 in an on-state to make a current flow through the inductor 42 in one direction, i.e., from the left toward the right as viewed in FIG. 4A. In FIG. 4B, the driver circuit 30 is in an off-state after the on-state shown in FIG. 4A.

In the state shown in FIG. 4A, the transistors 32 and 38 are turned on and the transistors 34 and 36 are turned off, so that a current flows through the transistor 32→the inductor 42→the transistor 38. When the current is thus supplied to the inductor 42, electric energy is accumulated in the inductor 42. After the transistors 32 and 38 have been turned off, electromotive force that tends to keep current flow through the inductor 42 is generated in the inductor 42.

FIG. 4B shows a state after the transistors 32 and 38 in the state shown in FIG. 4A have been turned off. When the electromotive force is generated in the inductor 42 by turning off the transistors 32 and 38, a current flows through the diode 48→the inductor 42→the diode 50. Thus, the driver circuit 30 is able to discharge the electric energy accumulated in the inductor 42.

Figure 5:
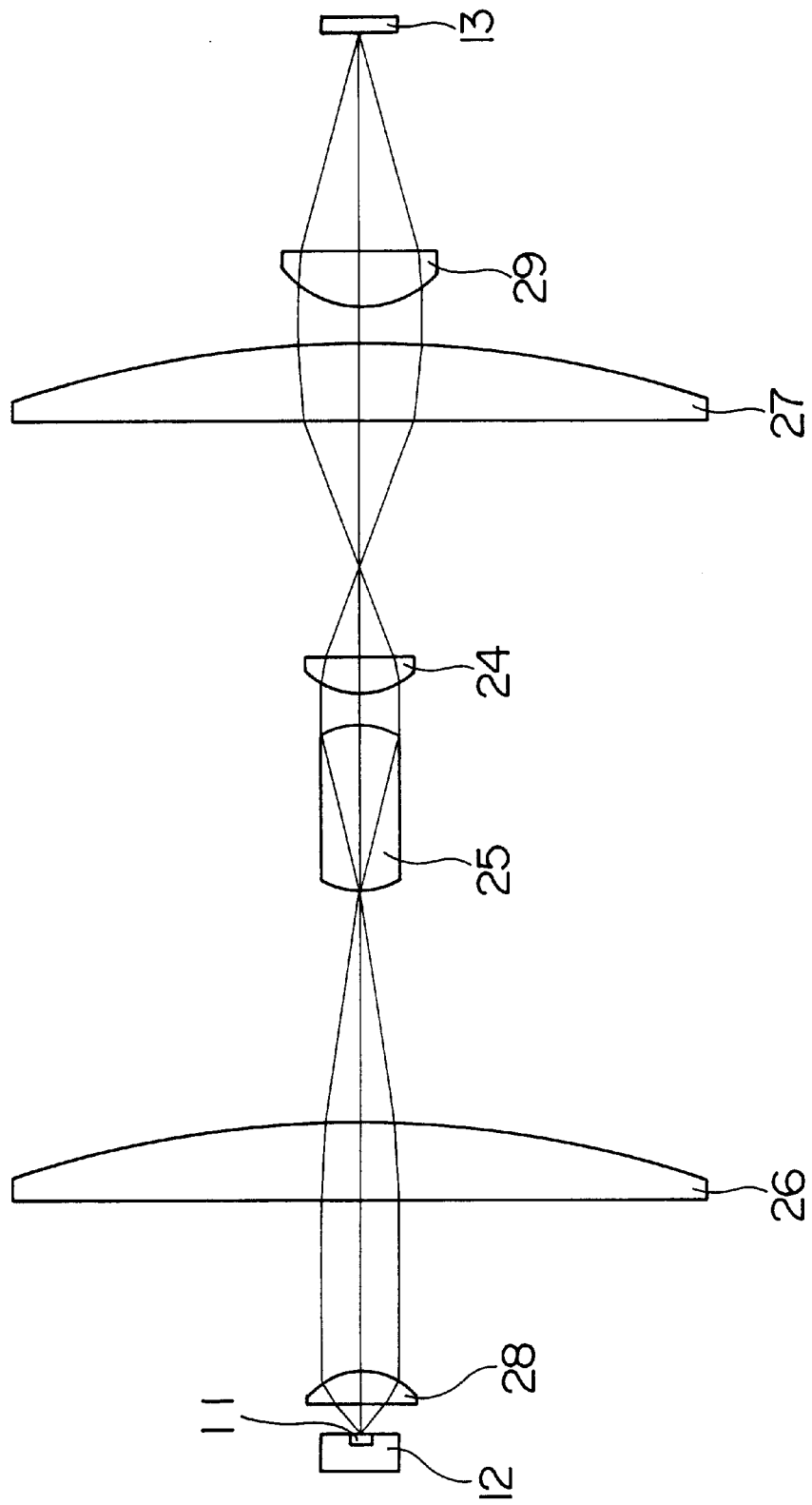
FIG. 5 is a diagram showing the waveform of power supplied by the driver circuit shown in FIG. 3 to an inductor.

FIG. 5 shows the waveform of power supplied to the inductor 42 by the driver circuit 30 by alternately repeating the on-state shown in FIG. 4A and the off-state shown in FIG. 4B. A mean power supplied to the inductor 42 is equal to the mean of power supplied to the inductor 42 while the driver circuit 30 is in the on-state and power supplied to the inductor 42 while the driver circuit 30 is in the off-state. Therefore, the longer the length of the off-state, the lower is the mean power supplied to the inductor 42.

The length of the off-state is dependent on the depletion of the power accumulated in the inductor 42. In the driver circuit 30, the time necessary for discharging the power accumulated in the inductor 42 is dependent on the operating speeds of the diodes 46, 48, 50 and 52. Therefore, the lower the operating speeds of the diodes 46, 48, 50 and 52 of the driver circuit 30, the greater is power loss, and the higher the operating speed of the diodes 46, 48, 50 and 52, the higher is the efficiency of driving the inductor 42.

In view of such facts, the driver circuit 30 includes, in addition to the bipolar transistors, semiconductor devices each provided with a diode capable of operating at a high operating speed. The construction and operation of the semiconductor device will be described with reference to FIGS. 6 and 7.

Figure 6:
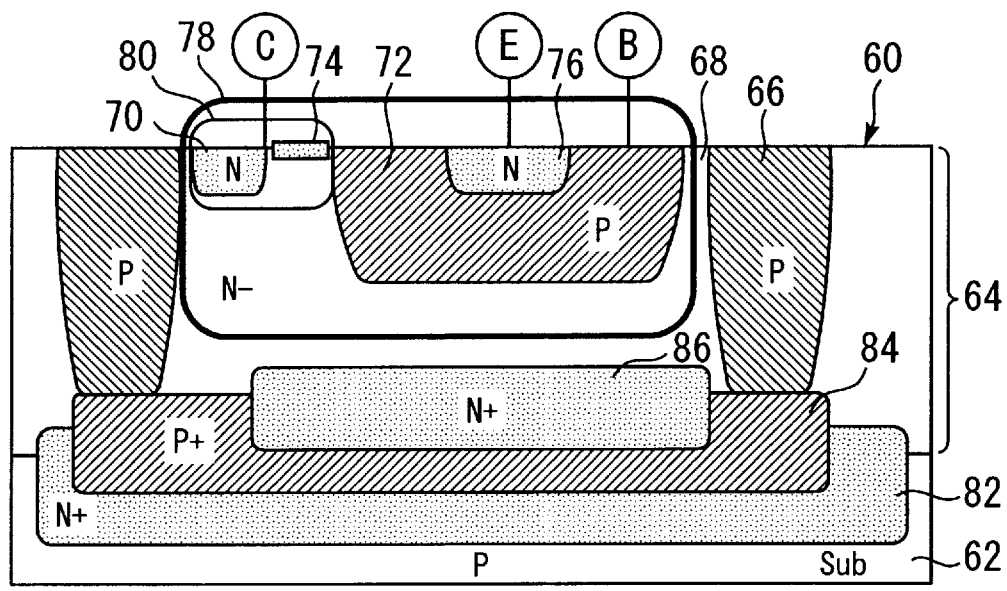
FIG. 6 is a typical sectional view of a semiconductor device in a first embodiment according to the present invention.

Referring to FIG. 6 showing a semiconductor device 60 in a first embodiment according to the present invention to be employed in the driver circuit 30, the semiconductor device 60 has a p-type semiconductor substrate 62. An n-type diffused layer 64 is formed on the semiconductor substrate 62. An individual collector region 68 is defined in the n-type diffused layer 64 by a p-type side-isolating layer 66.

An n-type collector terminal region 70, a p-type base region 72 and a metal terminal 74 are formed in the surface of the collector region 68. An n-type emitter region 76 is formed in the surface of the base region 72.

The collector region 68 including the collector terminal region 70, the base region 72 and the emitter region 76 constitute an npn bipolar transistor 78. The metal terminal 74, and the collector region 68 including the collector terminal region 70 constitute a Schottky diode 80.

An $N^+$-type floating buried layer 82 is formed in the vicinity of the boundary between the semiconductor substrate 62 and the n-type diffused layer 64. A $p^+$-type bottom-isolating layer 84 is formed in the surface of the floating buried layer 82. An $n^+$-type buried layer 86 is formed in the vicinity of the boundary between the bottom-isolating layer 84 and the collector layer 68.

The buried layer 86 reduces the collector resistance of the bipolar transistor 78 and suppresses the flow of leakage current from the bipolar transistor 78 to the semiconductor substrate 62. The bottom-isolating layer 84 is in contact with the bottom surface of the side-isolating layer 66. Thus, in this semiconductor device 60, the collector region 68 and the n-type buried layer 86 are surrounded by the p-type semiconductor, i.e., the p-type side-isolating layer 66 and the p-type bottom-isolating layer 84, and the p-type semiconductor is surrounded by the n-type diffused layer 64 and the n-type floating buried layer 82. Therefore, the bipolar transistor 78 can be entirely separated in potential from the semiconductor substrate 62. Thus, the semiconductor device 60 is capable of surely preventing the flow of leakage current from the bipolar transistor 78 to the semiconductor substrate 62.

Figure 7:
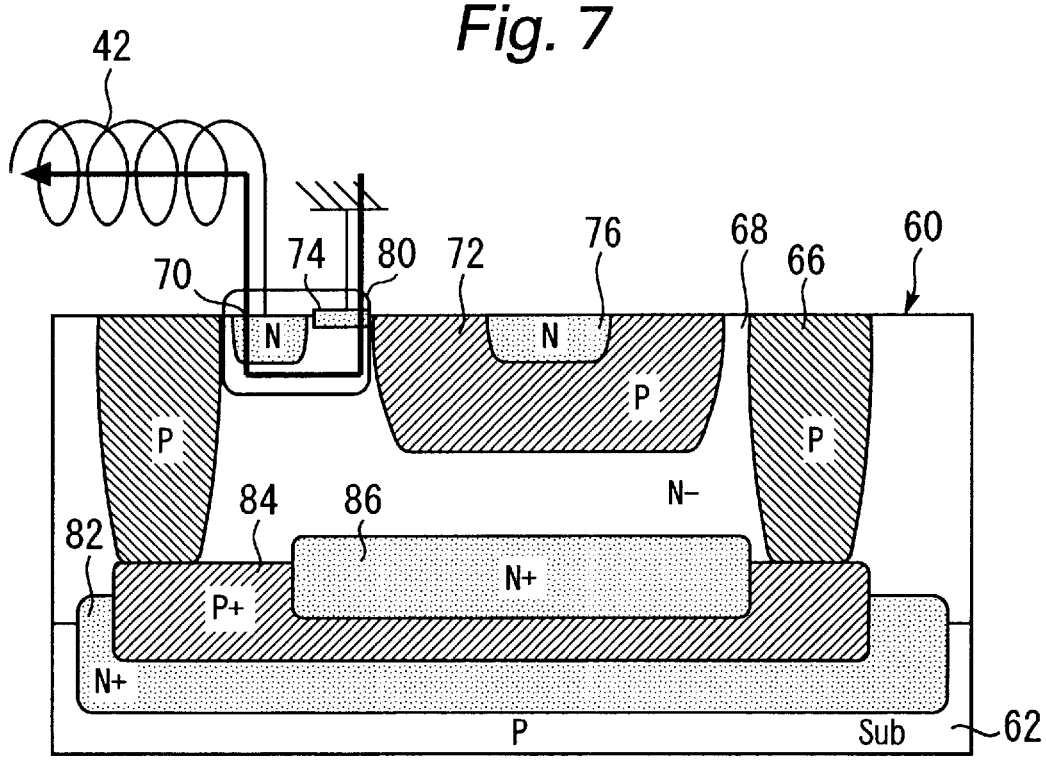
FIG. 7 is a typical sectional view of assistance in explaining the semiconductor device in the first embodiment.

FIG. 7 is a view of assistance in explaining the operation of the semiconductor device 60 shown in FIG. 6. More concretely, FIG. 7 is a view of assistance in explaining the operation of the semiconductor device 60 used as the transistor 34 and the diode 48 of the driver circuit 30 shown in FIG. 3 or 4. In this semiconductor device 60, the base region 72 is connected to the control circuit, not shown, the emitter 76 is connected to the grounding terminal 44, the collector terminal region 70 is connected to the first end of the inductor 42, and the metal terminal 74 of the Schottky diode 80 is connected to the grounding terminal 44.

Figure 1:
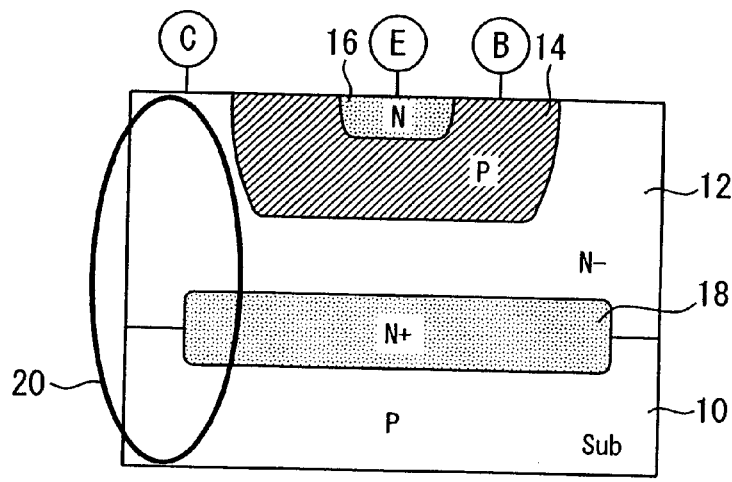
FIG. 1 is a typical sectional view of a conventional semiconductor device.
Figure 2:
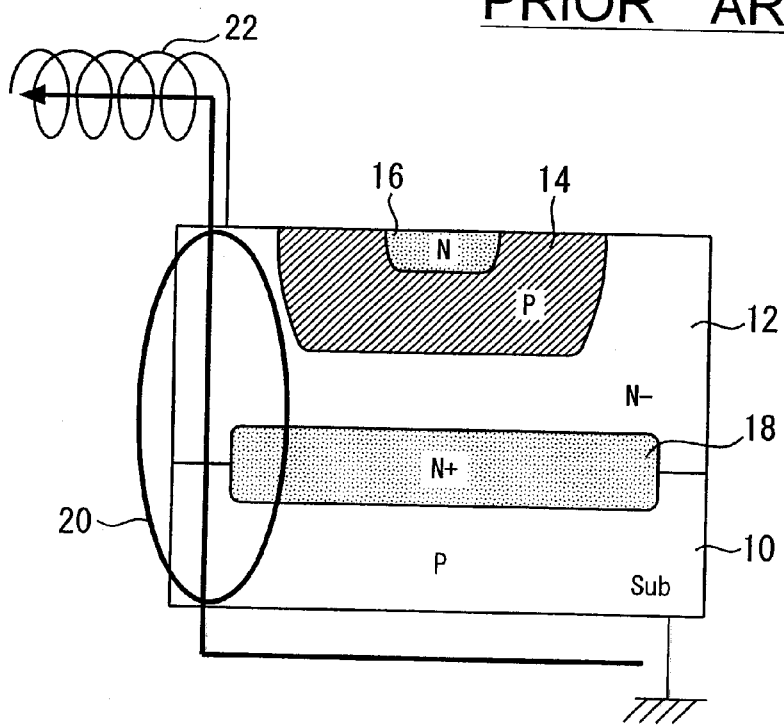
Figure 3:
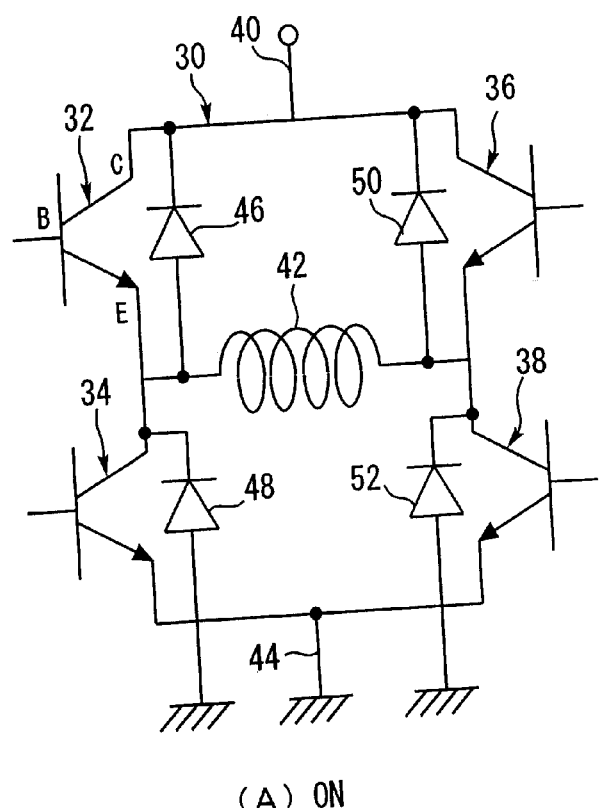
Figure 4:
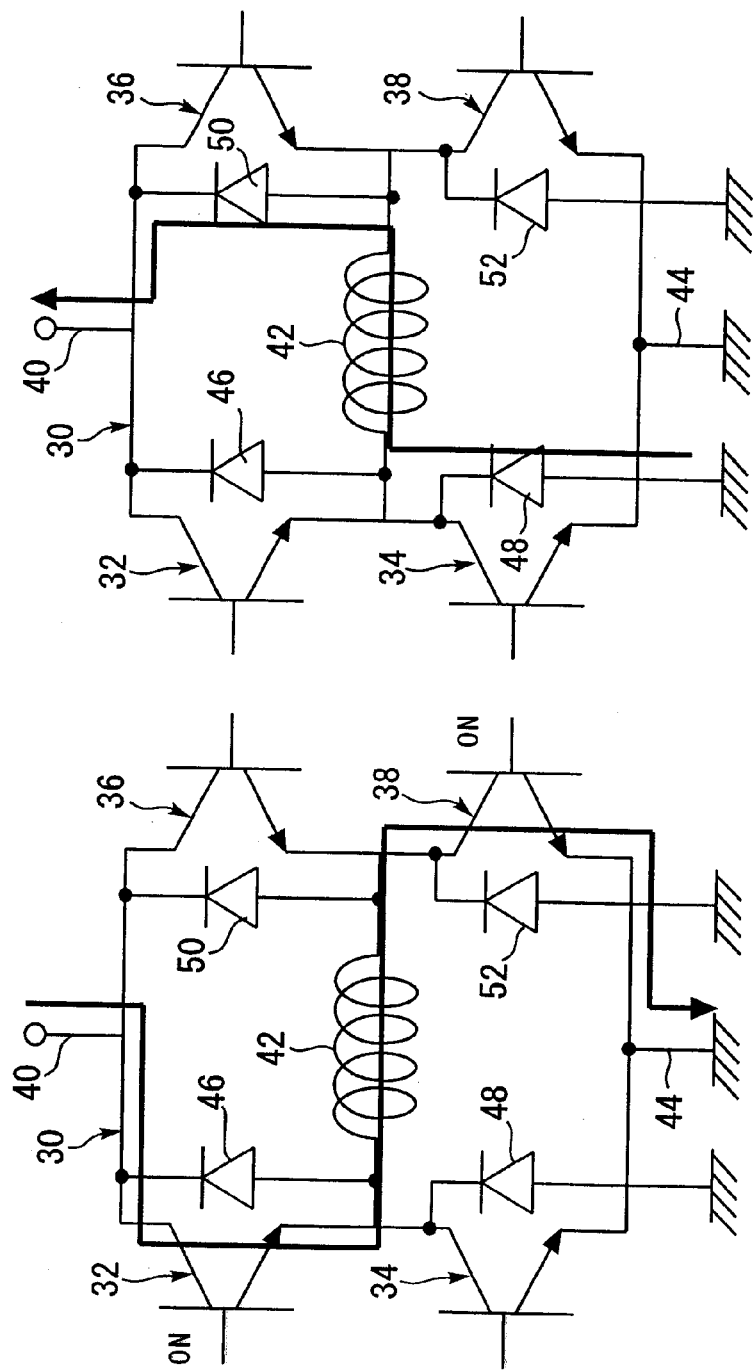
Figure 5:
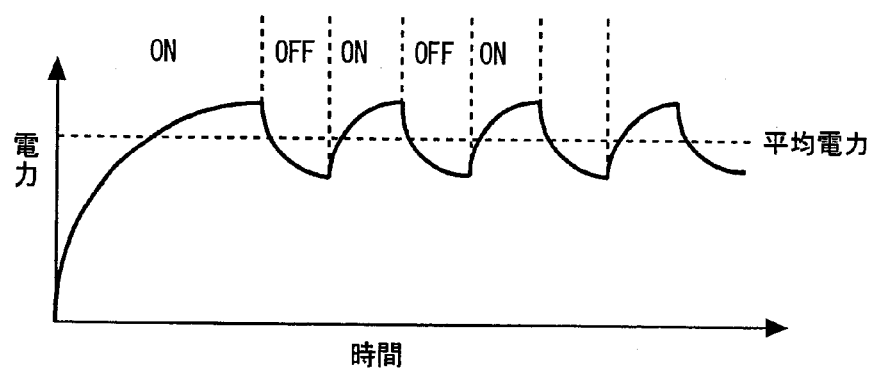
Figure 6:
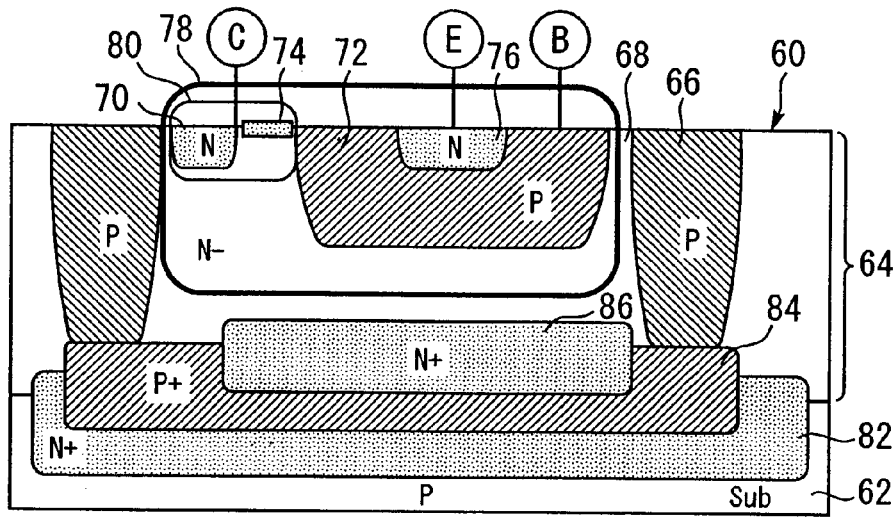
Figure 7:
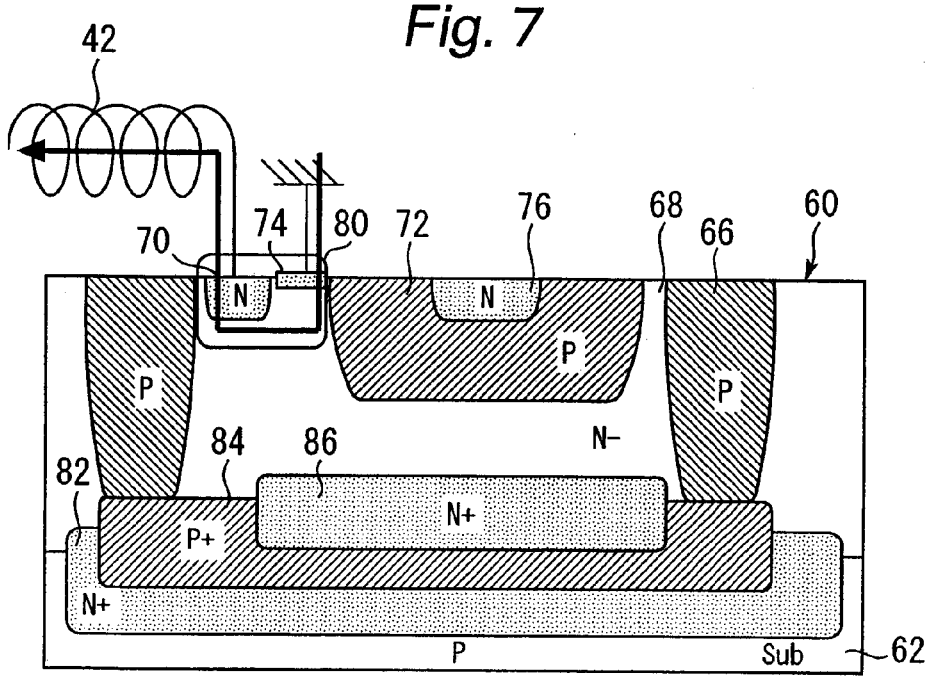
Figure 8:
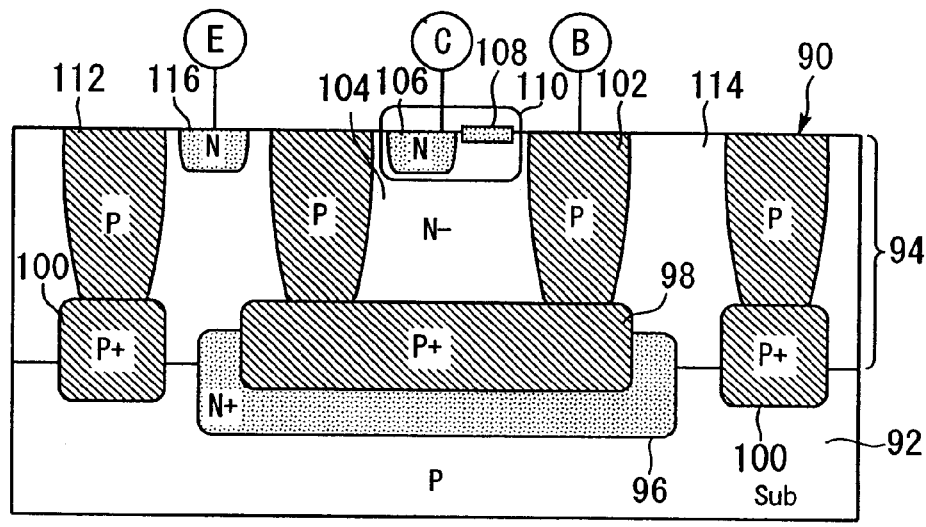
Figure 9:
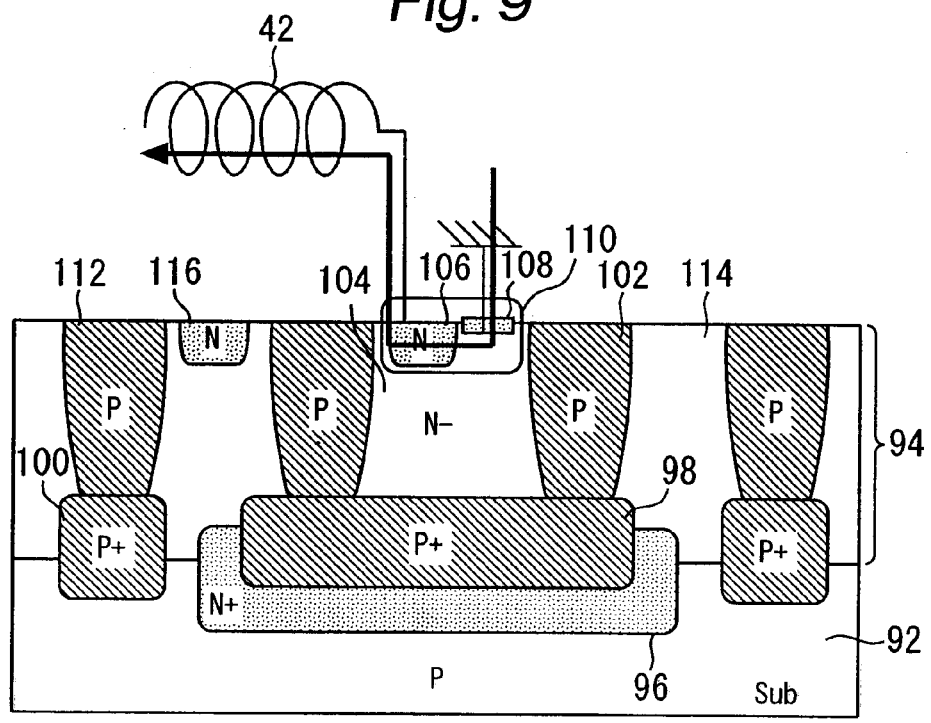
Figure 10:
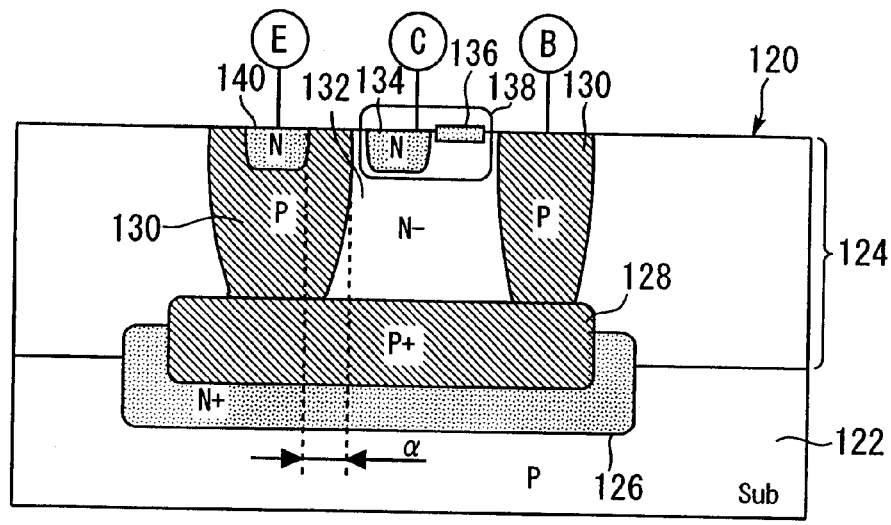
Figure 11:
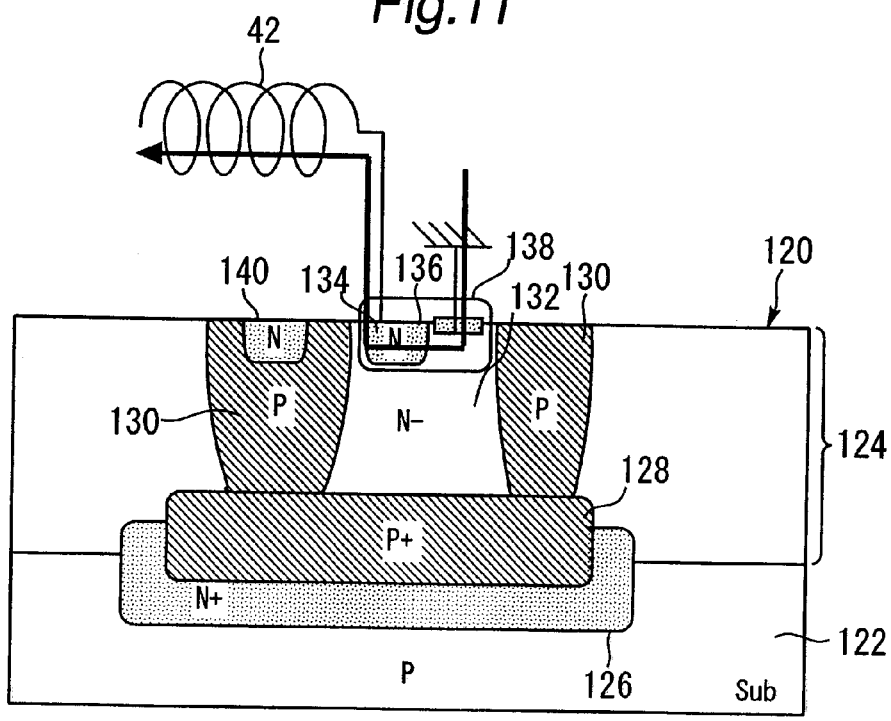

When the driver circuit 30 provided with the semiconductor device 60 is changed from the on-state to the off-state, a current flows through the Schottky diode 80 to discharge the electric energy accumulated in the inductor 42. The operating speed of the Schottky diode 80 is far higher than that of a pn-junction diode. Therefore, the semiconductor device 60 in the first embodiment, as compared with the conventional semiconductor device shown in FIGS. 1 and 2, is capable of discharging the electric energy accumulated in the inductor 42 in a short time to reduce the length of the off-state of the driver circuit 30; that is, the semiconductor device 60 in the first embodiment, as compared with the conventional semiconductor device shown in FIG. 1 or 2, is more effective in reducing power loss in driving the inductor 42.

Since the bipolar transistor 78 is perfectly isolated in potential from the semiconductor substrate 62, the flow of current from the semiconductor substrate 62 into the collector region 68 can be prevented. Thus, the semiconductor device 60 in the first embodiment is capable of perfectly preventing power loss attributable to a collector/substrate diode and, consequently, the driver circuit 30 employing the semiconductor device 60 in the first embodiment causes only a small power loss.

The npn bipolar transistor of the semiconductor device 60 in the first embodiment may be replaced with a pnp bipolar transistor.

Second Embodiment

A semiconductor device 90 in a second embodiment according to the present invention will be described with reference to FIGS. 8 and 9. The semiconductor device 90, similarly to the semiconductor device 60 in the first embodiment, can be used as a component of the driver circuit 30 shown in FIG. 1.

Figure 8:
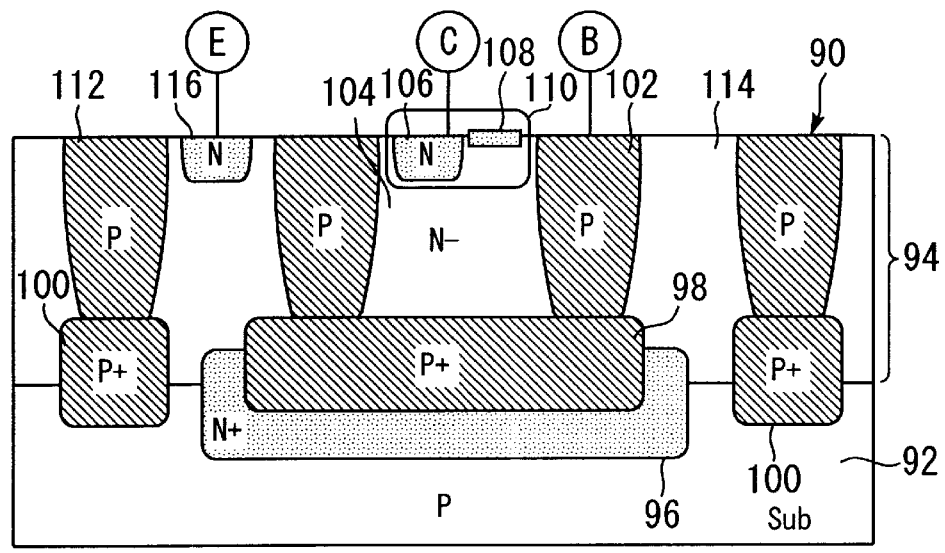
FIG. 8 is a typical sectional view of a semiconductor device in a second embodiment according to the present invention.

Referring to FIG. 8, the semiconductor device 90 has a p-type semiconductor substrate 92. An n-type diffused layer 94 is formed on the semiconductor substrate 92. An $n^+$-type floating buried layer 96 is formed in the vicinity of the boundary between the semiconductor substrate 92 and the n-type diffused layer 94. A $p^+$-type buried layer 98 is formed in the surface of the floating buried layer 96.

A $p^+$-type buried layer 100 is formed in the vicinity of the boundary of the semiconductor substrate 92 and the n-type diffused layer 94 so as to surround the floating buried layer 96. The $p^+$-type buried layer 100 and the $p^+$-type buried layer 98 may be simultaneously formed by the same doping process.

An annular p-type diffused layer 102 is formed in the n-type diffused layer 94 so as to extend between the surface of the $p^+$-type buried layer 98 and the surface of the n-type diffused layer 94. The p-type diffused layer 102 surrounds a collector region 104. The p-type diffused layer 102, together with the $p^+$type buried layer 98, serves as the base region of a bipolar transistor.

An n-type collector terminal region 106 and a metal terminal 108 are formed in the surface of the collector region 104. The metal terminal 108 and the collector region 104 (and the collector terminal region 106) form a Schottky diode 110.

An annular p-type diffused layer 112 is formed in the n-type diffused layer 94 so as to extend between the surface of the $p^+$-type buried layer 100 and the surface of the n-type diffused layer 94. The p-type diffused layer 112 surrounds an n-type emitter region 114. An emitter terminal region 116 is formed in the surface of the emitter region 114.

In the semiconductor device 90 in the second embodiment, the collector region 104 (and the collector terminal region 106), the p-type diffused layer 102 (base region) and the emitter region 114 (and the emitter terminal region 116) constitute an npn bipolar transistor.

In the semiconductor device 90 shown in FIG. 8, the n-type collector region 104 is surrounded by the p-type diffused layer 102 and the $p^+$-type buried layer 98 (p-type semiconductor), and the p-type diffused layer 102 and the $p^+$-type buried layer 98 are surrounded by the n-type emitter region 114 and the $n^+$-type floating buried layer 96 (n-type semiconductor). Thus the collector region 104 can be perfectly separated in potential from the semiconductor substrate 92. Thus the semiconductor device 90 in the second embodiment is capable of surely preventing the flow of leakage current from the collector region 104 to the semiconductor substrate 92.

Figure 9:
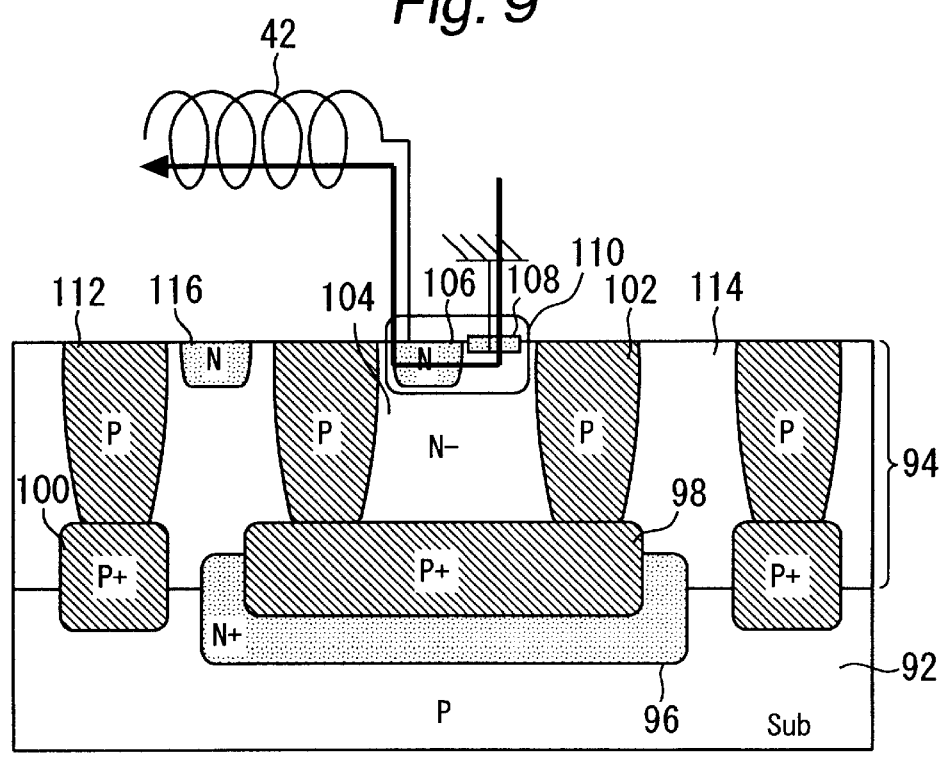
FIG. 9 is a typical sectional view of assistance in explaining the semiconductor device in the second embodiment.

FIG. 9 is a view of assistance in explaining the operation of the semiconductor device 90 shown in FIG. 8. More concretely, FIG. 9 is a view of assistance in explaining one of the operations of the semiconductor device 90 used as the transistor 34 and the diode 48 of the driver circuit 30 shown in FIG. 3 or 4. The base, i.e., the p-type diffused layer 102, is connected to the control circuit, not shown, the emitter terminal region 116 is connected to the grounding terminal 44, the collector terminal region 106 is connected to the first end of the inductor 42, and the metal terminal 108 of the Schottky diode 110 is connected to the grounding terminal 44.

When the driver circuit 30 provided with the semiconductor device 90 is changed from the on-state to the off-state, a current flows through the Schottky diode 110 to discharge the electric energy accumulated in the inductor 42. The operating speed of the Schottky diode 110 is far higher than that of a pn-junction diode. Therefore, the semiconductor device 90 in the second embodiment, similarly to the semiconductor device 60 in the first embodiment, is capable of discharging the electric energy accumulated in the inductor 42 in a short time to reduce the length of the off-state of the driver circuit 30; that is, the semiconductor device 90 in the second embodiment, similarly to the semiconductor device 60 in the first embodiment, is capable of effectively reducing power loss in driving the inductor 42.

Since the collector region 104 of the semiconductor device 90 is perfectly separated in potential from the semiconductor substrate 92, the flow of current from the semiconductor substrate 92 into the collector region 104 can be prevented. Thus, the semiconductor device 90 in the second embodiment is capable of perfectly preventing power loss attributable to a collector/substrate diode and, consequently, the driver circuit 30 employing the semiconductor device 90 in the second embodiment causes only a small power loss.

In the semiconductor device 60 in the first embodiment, the buried layer 86 is formed on the bottom-isolating layer 84 to prevent the flow of leakage current and to reduce collector resistance. In the semiconductor device 90 in the second embodiment, the flow of leakage current can be prevented and collector resistance can be reduced without forming any layer corresponding to the buried layer 86 because the collector region 104 is surrounded by the base region, i.e., the p-type diffused layer 102 and the $p^+$-type buried layer 98. Thus the number of steps of a process for fabricating the semiconductor device 90 in the second embodiment is less than that of a process for fabricating the semiconductor device 60 in the first embodiment. Consequently, the semiconductor device 90 improves yield and reduces manufacturing cost.

The npn bipolar transistor of the semiconductor device 90 in the second embodiment may be replaced with a pnp bipolar transistor.

The p-type diffused layer 102 and the $p^+$-type buried layer 98, and the collector layer 114 and the floating diffused layer 96 of the semiconductor device 90 in the second embodiment correspond to "potential isolating layers" stated in claim 1.

The p-type diffused layer 102 and the $p^+$-type buried layer 98 of the semiconductor device 90 in the second embodiment correspond to "side-isolating layer" and "bottom-isolating layer", respectively, stated in claim 4.

Third Embodiment

A semiconductor device 120 in a third embodiment according to the present invention will be described with reference to FIGS. 10 and 11. The semiconductor device 120, similarly to the semiconductor devices 60 in the first embodiment or the semiconductor device 90 in the second embodiment, can be used as a component of the driver circuit 30 shown in FIG. 1.

Figure 10:
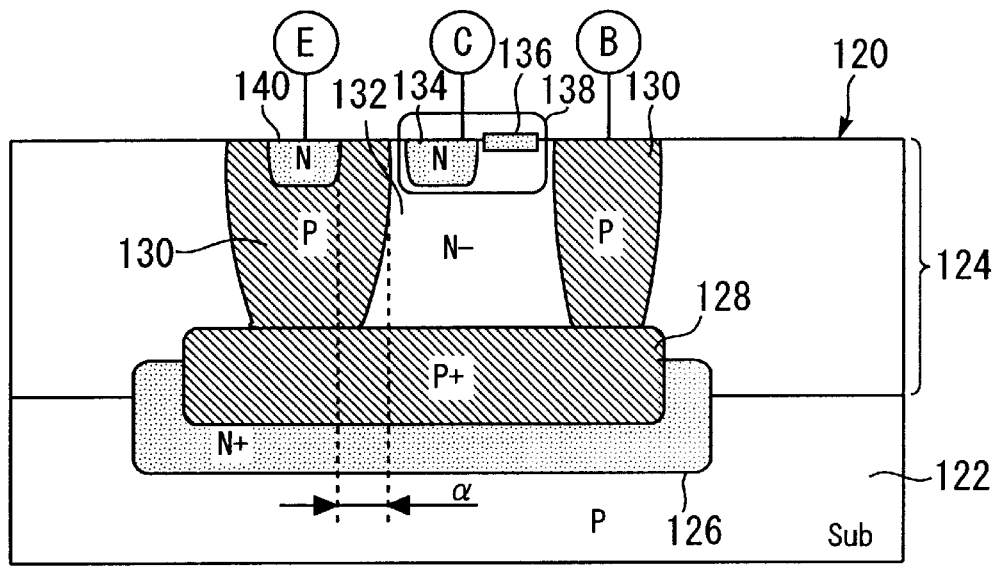
FIG. 10 is a typical sectional view of a semiconductor device in a third embodiment according to the present invention.

Referring to FIG. 10, the semiconductor device 120 has a p-type semiconductor substrate 122. An n-type diffused layer 124 is formed on the semiconductor substrate 122. An n$^+$-type floating buried layer 126 is formed in the vicinity of the boundary between the semiconductor substrate 122 and the n-type diffused layer 124. A p$^+$-type buried layer 128 is formed in the surface of the floating buried layer 126.

An annular p-type diffused layer 130 is formed in the n-type diffused layer 124 so as to extend between the surface of the p$^+$-type buried layer 128 and the surface of the n-type diffused layer 124. The p-type diffused layer 130 surrounds a collector region 132. The p-type diffused layer 130, together with the p$^+$-type buried layer 128, serves as the base region of a bipolar transistor.

An n-type collector terminal region 134 and a metal terminal 136 are formed in the surface of the collector region 132. The metal terminal 136 and the collector region 132 (and the collector terminal region 134) form a Schottky diode 138.

In the semiconductor device 120 in the third embodiment, an n-type emitter region 140 is formed in the surface of the p-type diffused layer 130 (base region). The emitter region 140, the collector region 132 (and the collector terminal region 134), the p-type diffused layer 130 and the p$^+$-type buried layer 128 (base region) constitute an npn bipolar transistor.

In the semiconductor device 120 shown in FIG. 10, the n-type collector region 132 is surrounded by the p-type diffused layer 130 and the p$^+$-type buried layer 128 (p-type semiconductor), and the p-type diffused layer 130 and the p$^+$-type buried layer 128 are surrounded by the n-type diffused layer 124 and the n$^+$-type floating buried layer 126 (n-type semiconductor). Thus the collector region 132 can be perfectly separated in potential from the semiconductor substrate 122. Thus the semiconductor device 120 in the third embodiment is capable of surely preventing the flow of leakage current from the collector region 132 to the semiconductor substrate 122.

Figure 11:
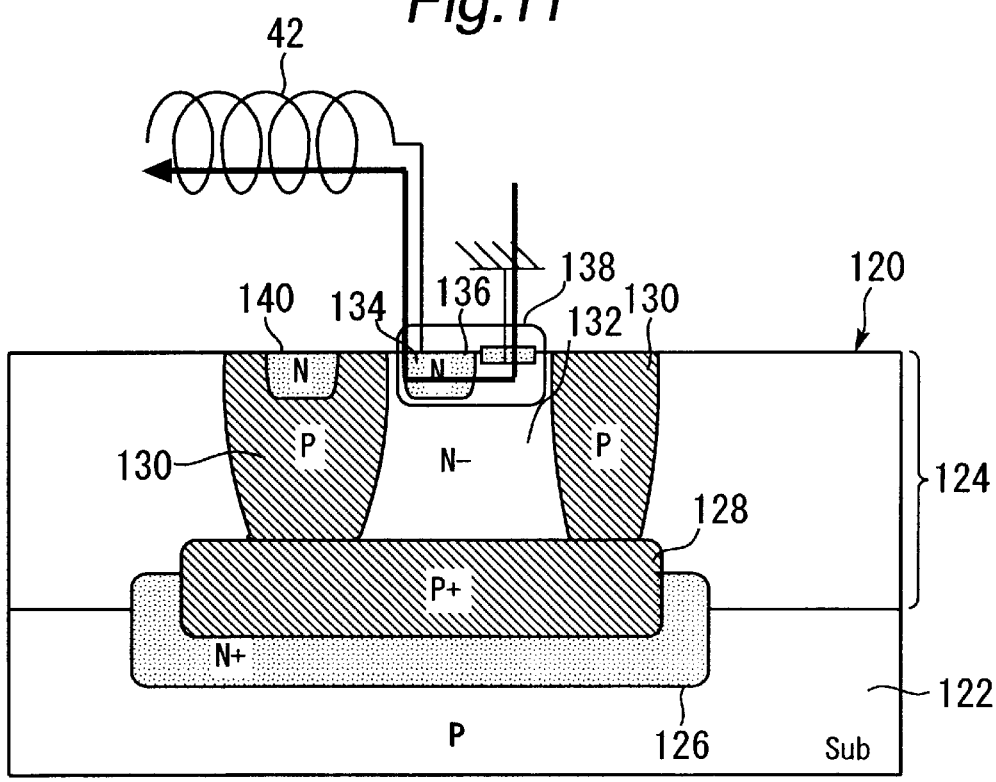
FIG. 11 is a typical sectional view of assistance in explaining the semiconductor device in the third embodiment.

FIG. 11 is a view of assistance in explaining one of the operations of the semiconductor device 120 shown in FIG. 10. More concretely, FIG. 11 is a view of assistance in explaining the operation of the semiconductor device 120 used as the transistor 34 and the diode 48 of the driver circuit 30 shown in FIG. 3 or 4. The base region, i.e., the p-type diffused layer 130, is connected to the control circuit, not shown, the emitter region 140 is connected to the grounding terminal 44, the collector terminal region 134 is connected to the first end of the inductor 42, and the metal terminal 136 of the Schottky diode 138 is connected to the grounding terminal 44.

When the driver circuit 30 provided with the semiconductor device 120 is changed from the on-state to the off-state, a current flows through the Schottky diode 138 to discharge the electric energy accumulated in the inductor 42. The operating speed of the Schottky diode 138 is far higher than that of a pn-junction diode. Therefore, the semiconductor device 120 in the third embodiment, similarly to the semiconductor device 60 in the first embodiment, is capable of discharging the electric energy accumulated in the inductor 42 in a short time to reduce the length of the off-state of the driver circuit 30; that is, the semiconductor device 120 in the third embodiment, similarly to the semiconductor device 60 in the first embodiment, is capable of effectively reducing power loss in driving the inductor 42.

Since the collector region 132 of the semiconductor device 120 is perfectly separated in potential from the semiconductor substrate 122, the flow of current from the semiconductor substrate 122 into the collector region 132 can be prevented. Thus, the semiconductor device 120 in the third embodiment is capable of perfectly preventing power loss attributable to a collector/substrate diode and, consequently, the driver circuit 30 employing the semiconductor device 120 in the third embodiment causes only a small power loss.

In the semiconductor device 120 in the third embodiment, the bipolar transistor has lateral npn construction; that is, the bipolar transistor has npn construction in which the distance a between the boundary of the p-type diffused layer 130 and the collector region 132 and the boundary between the emitter region 140 and the p-type diffused layer 130, i.e., the distance on the surface of the n-type diffused layer 124, is substantially equal to the base length. The base length can be easily controlled on the pattern of the bipolar transistor and the hFE control of the transistor can be easily achieved.

The third embodiment, similarly to the second embodiment, does not need any n-type buried layer on the p$^+$-type buried layer 128, which facilitate the fabrication of the semiconductor device, improves yield and reduces cost.

The npn bipolar transistor of the semiconductor device 120 in the third embodiment may be replaced with a pnp bipolar transistor.

The p-type diffused layer 130 and the p$^+$-type buried layer 128, and the n-type diffused layer 124 and the floating diffused layer 126 of the semiconductor device 120 in the third embodiment correspond to "potential isolating layers" stated in claim 1.

The p-type diffused layer 130 and the p$^+$-type buried layer 128 correspond to "side-isolating layer" and "bottom-isolating layer", respectively, stated in claim 4.

The features and the advantages of the present invention as described above may be summarized as follows.

According to one aspect of the present invention, electric energy accumulated in an inductor of a driven circuit can be discharged in a short time by using a Schottky diode. Since a collector region is isolated in potential from a semiconductor substrate, power loss attributable to a collector/substrate diode can be prevented. Accordingly, a semiconductor device of the present invention is useful for forming a driver circuit that causes only a small power loss.

In another aspect, a potential isolating layer includes a side-isolating layer surrounding the side of a bipolar transistor. A bottom-isolating layer covers the bottom of the bipolar transistor. A floating buried layer is interposed between the bottom-isolating layer and the semiconductor substrate. Accordingly, the collector region and the semiconductor substrate can be properly isolated in potential from each other.

In another aspect, a buried layer is formed in the vicinity of the boundary between the collector region and the bottom-isolating layer. Accordingly, the collector resistance of the bipolar transistor can be reduced the flow of leakage current from the bipolar transistor to the semiconductor substrate can be suppressed.

In another aspect, a potential isolating layer includes a side-isolating layer surrounding the side of the collector region. A bottom-isolating layer covers the bottom of the collector region. A floating buried layer is interposed between the bottom-isolating layer and the semiconductor substrate. Accordingly, the collector region and the semiconductor substrate can be properly isolated in potential from each other.

In another aspect, the side-isolating layer is used as a base region and the base region is surrounded by an emitter region. Accordingly, the bipolar transistor can be formed in a compact structure.

In another aspect, the side-isolating layer is used as a base region and an emitter region is formed in the base region. Accordingly, the bipolar transistor can be formed in a compact structure.

In the semiconductor device the collector region may be formed of a semiconductor of a first conduction type, and the semiconductor substrate may be formed of a semiconductor of a second conduction type. The potential isolating layer may includes a side-isolating layer of the second conduction type surrounding a side of the bipolar transistor, a bottom-isolating layer of the second conduction type covering a bottom of the bipolar transistor, and a floating buried layer of the first conduction type interposed between the bottom-isolating layer and the semiconductor substrate.

In the semiconductor device, the bipolar transistor may have a collector region surrounded by the side-isolating layer, a base region formed in the collector region, and an emitter region formed in the base region. A buried layer of the first conduction type may be formed in the vicinity of the boundary between the collector region and the bottom-isolating layer.

In the semiconductor device, the collector region may be formed of a semiconductor of a first conduction type, and the semiconductor substrate may be formed of a semiconductor of a second conduction type. The potential isolating layer may include a side-isolating layer of the second conduction type surrounding a side of the collector region, a bottom-isolating layer of the second conduction type covering a bottom of the collector region, and a floating buried layer of the first conduction type interposed between the bottom-isolating layer and the semiconductor substrate.

In the semiconductor device, the bipolar transistor may have a base region formed by the side-isolating layer, and an emitter region surrounding the base region.

In the semiconductor device, the bipolar transistor may have a base region formed on the side-isolating layer, and an emitter region formed in the base region.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-221214, filed on Jul. 23, 2001 including specification, claims, drawings and summary, on which the Convention priority of the present application is based, are incorporated herein by reference in its entirety.

What is claimed is:

1. A semiconductor device comprising:

a semiconductor substrate;

a bipolar transistor formed on the semiconductor substrate and having a collector region;

a Schottky diode formed in the collector region of the bipolar transistor; and a potential isolating layer isolating the collector region and the semiconductor substrate in potential from each other, wherein the collector region is formed of a semiconductor of a first conduction type, the semiconductor substrate is formed of a semiconductor of a second conduction type, and the potential isolating layer includes a side-isolating layer of the second conduction type surrounding a side of the bipolar transistor, a bottom-isolating layer of the second conduction type covering a bottom of the bipolar transistor, and a floating buried layer of the first conduction type interposed between the bottom-isolating layer and the semiconductor substrate.

2. The semiconductor device according to claim 1, wherein the bipolar transistor has a collector region surrounded by the side-isolating layer, a base region formed in the collector region, and an emitter region formed in the base region; and a buried layer of the first conduction type is formed in the vicinity of the boundary between the collector region and the bottom-isolating layer.

3. A semiconductor device comprising:

a semiconductor substrate;

a bipolar transistor formed on the semiconductor substrate and having a collector region;

a Schottky diode formed in the collector region of the bipolar transistor; and a potential isolating layer isolating the collector region and the semiconductor substrate in potential from each other, wherein the collector region is formed of a semiconductor of a first conduction type, the semiconductor substrate is formed of a semiconductor of a second conduction type, and the potential isolating layer includes a side-isolating layer of the second conduction type surrounding a side of the collector region, a bottom-isolating layer of the second conduction type covering a bottom of the collector region, and a floating buried layer of the first conduction type interposed between the bottom-isolating layer and the semiconductor substrate.

4. The semiconductor device according to claim 3, wherein the bipolar transistor has a base region formed by the side-isolating layer, and an emitter region surrounding the base region.

5. The semiconductor device according to claim 3, wherein the bipolar transistor has a base region formed on the side-isolating layer, and an emitter region formed in the base region.

* * * * *

UNITED STATES PATENT AND TRADEMARK OFFICE
CERTIFICATE OF CORRECTION

PATENT NO. : 6,573,582 B2
DATED : June 3, 2003
INVENTOR(S) : Yasunori Yamashita et al.

It is certified that error appears in the above-identified patent and that said Letters Patent is hereby corrected as shown below:

Title page,
After Item [57], ABSTRACT, change "8 Drawing Sheets" to -- 7 Drawing Sheets --.

Drawings,
Replace Drawing Sheets 1 - 8 with the attached Drawing Sheets 1 - 7

Signed and Sealed this

Sixteenth Day of September, 2003

JAMES E. ROGAN
*Director of the United States Patent and Trademark Office*

(A) ON